United States Patent
Jung et al.

(10) Patent No.: US 7,137,091 B1
(45) Date of Patent: Nov. 14, 2006

(54) HIERARCHICAL REPEATER INSERTION

(75) Inventors: Dae Suk Jung, Sunnyvale, CA (US); Manoj Gopalan, Milpitas, CA (US); Yu-Yen Mo, San Jose, CA (US); Seong Rai Cho, San Jose, CA (US); Venkat R. Podduturi, San Jose, CA (US); Yet-Ping Pai, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 261 days.

(21) Appl. No.: 10/778,639

(22) Filed: Feb. 13, 2004

(51) Int. Cl.
*G06F 17/50* (2006.01)
(52) U.S. Cl. .................... 716/6; 716/5; 716/4
(58) Field of Classification Search .......... 716/6, 716/5, 4
See application file for complete search history.

(56) References Cited

U.S. PATENT DOCUMENTS 6,204,713 B1* 3/2001 Adams et al. ............... 327/295
6,550,045 B1* 4/2003 Lu et al. ........................ 716/6
6,594,807 B1* 7/2003 Tetelbaum et al. ............ 716/6
6,757,795 B1* 6/2004 Barri et al. .................. 711/158

* cited by examiner

*Primary Examiner*—Vuthe Siek
*Assistant Examiner*—Tuyen To
(74) *Attorney, Agent, or Firm*—Martine Penilla & Gencarella, LLP

(57) ABSTRACT

A method and system for inserting repeaters at different levels in a processor hierarchy involve tracing a net in a processor circuit followed by inserting repeaters at different locations in the net. The net is a circuit trace of wiring between circuit elements of a circuit, the net being divided into two nets. One net includes internal circuit elements of a processor component and another net includes external circuit elements of a processor component. A repeater solution, which includes inserted repeaters coupled to the internal circuit elements, is instantiated to other processor components. Subsequently, after instantiation of the repeater solution, repeaters are inserted in the nets external to the processor component.

9 Claims, 7 Drawing Sheets

HIERARCHICAL REPEATER INSERTION

BACKGROUND OF THE INVENTION

1. Field of the Invention

The present invention relates to semiconductor design, and more specifically to optimizing semiconductor repeater design.

2. Description of the Related Art

A central processing unit (CPU) typically includes many components such as a processor core, cache memory, and registers. Further, within the components are logic elements such as NOR, NAND and inverters, which are manufactured from circuit elements such as transistors and conductive wires. Designing the CPU involves resolving many problems such as accounting for multiple operating frequencies between the components, jitter, and attenuation. For example, if a processor core operates at a higher frequency than a register outside the processor core, resulting in clock timing differences between the components, then a phase-locked loop (PLL) or delay-locked loop (DILL) circuit can resolve the differences. DLL circuits can also resolve jitter, which is noise propagated along a signal by other circuit elements, such as a power supply. Similarly, other circuit elements can resolve attenuation, which is the reduction of a signal during transmission.

FIG. 1 is a diagram illustrating a central processing unit having multiple cores. A CPU 100 can include multiple cores 110 and modules 130 connected together via connectors 120. The connector 120 is a conductive interconnect metal line (e.g. copper or the like) and module 130 can be memory or an I/O controller. Cores 110 can also have a driver 150, a transceiver 155, and a receiver 160. The driver 150 can drive a signal to the transceiver 155, which receives the signal and transmits to the receiver 160. Connectors 120 can also have multiple repeater locations 140. Further, a core solution 170 can include two repeater locations 140 in the core 110.

During the design phase, an optimal repeater solution includes multiple repeater locations 140 that propagate signals along the connectors 120 with minimal problems. However, by designing the optimal repeater solution, each component will have different repeater solutions. For example, as shown in FIG. 1, one core 110 has the core solution 170 while another core 110 does not. In a design that includes more than two cores, the problem of different repeater solutions increase development costs because each core 110 can have different core solutions 170.

Another problem from the design illustrated in FIG. 1 is the placement of multiple repeater solutions 140 between the cores 110 and modules 130. When the CPU 100 has one core 110 with the core solution 170 and another core 110 without the core solution 170, the CPU 100 includes many repeater locations 140 outside the cores 110. These repeater locations 140 take up valuable space on the CPU 100 and further add circuit elements that increase the operating temperature of the CPU 100.

Accordingly, what is needed is a method and apparatus for inserting repeaters in a CPU 100 to solve problems such as resolving multiple clock frequencies and attenuation, while reducing design and manufacturing costs.

SUMMARY OF THE INVENTION

Broadly speaking, the present invention is a method and system for hierarchical repeater insertion. It should be appreciated that the present invention can be implemented in numerous ways, such as a process, an apparatus, a system, a device or a method on a computer readable medium. Several inventive embodiments of the present invention are described below.

In one embodiment, a processor comprises at least one component including a plurality of circuit elements having a first interconnect capable of connecting the plurality of circuit elements and at least one module external to the at least one component coupled to a second interconnect that is external to the at least one component, the second interconnect capable of connecting the at least one module to the plurality of circuit elements. The processor also comprises a first repeater coupled to the first interconnect in a repeater solution, the first repeater being capable of insertion in other locations of the first interconnect in accordance with the repeater solution, wherein the repeater solution is capable of duplication to components other than the at least one component, and a second repeater coupled to the second interconnect after the repeater solution.

In another embodiment, a circuit comprises a first circuit element and a second circuit element coupled together by a connector, wherein a first repeater is coupled to the connector between the first circuit element and the second circuit element within a boundary and defining a repeater solution, the repeater solution being capable of duplication. The circuit further comprises a third circuit element external to the boundary coupled to the connector after the duplication of the repeater solution, wherein a second repeater external to the boundary is coupled to the connector between the first circuit element, second circuit element and third circuit element.

In yet another embodiment, a method comprises tracing at least one net in a first core, solving the at least one net in the first core by identifying at least one repeater location, determining a repeater solution from the first core, duplicating the repeater solution by instantiation to a second core, and determining a repeater solution in a region of the circuit outside of the first core and the second core.

Further, another embodiment is a computer program embodied on a computer readable medium for hierarchical repeater insertion, comprising program instructions that produce a netlist in a processor from a plurality of nets, the processor including at least one processor core and program instructions that flatten the nets in the netlist, the netlist including a first net internal to the at least one processor core and a second net external to the at least one processor core. The computer program on a computer readable medium also comprises program instructions that solve the first net by inserting repeaters, program instructions that analyze and selects solutions from the solved first net, program instructions that instantiate a selected solution from at least one processor core in a level in a hierarchy, and program instruction that insert repeaters in a top level net, the top level net including the second net.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

In the embodiments that follow, a method and system for hierarchical repeater insertion resolves problems inherent in processor design. Particularly, a processor design includes inserted repeaters within components such as a core. Although the following embodiments discuss the insertion of repeaters in cores, the use of cores is purely exemplary. Any other component can be used in other embodiments.

The inserted repeaters define a repeater solution, which is then instantiated to other components. Subsequently, multiple repeater solutions are instantiated until the hierarchical repeater solutions are fully instantiated within the processor. As used herein, a "processor" can include one or more processing cores. In embodiments having more than one core, the processor can be referred to as a "multi-core" processor. It will be obvious, however, to one skilled in the art, that the present invention may be practiced without some or all of these specific details. In other instances, well known process operations have not been described in detail in order not to unnecessarily obscure the present invention.

Figure 1:
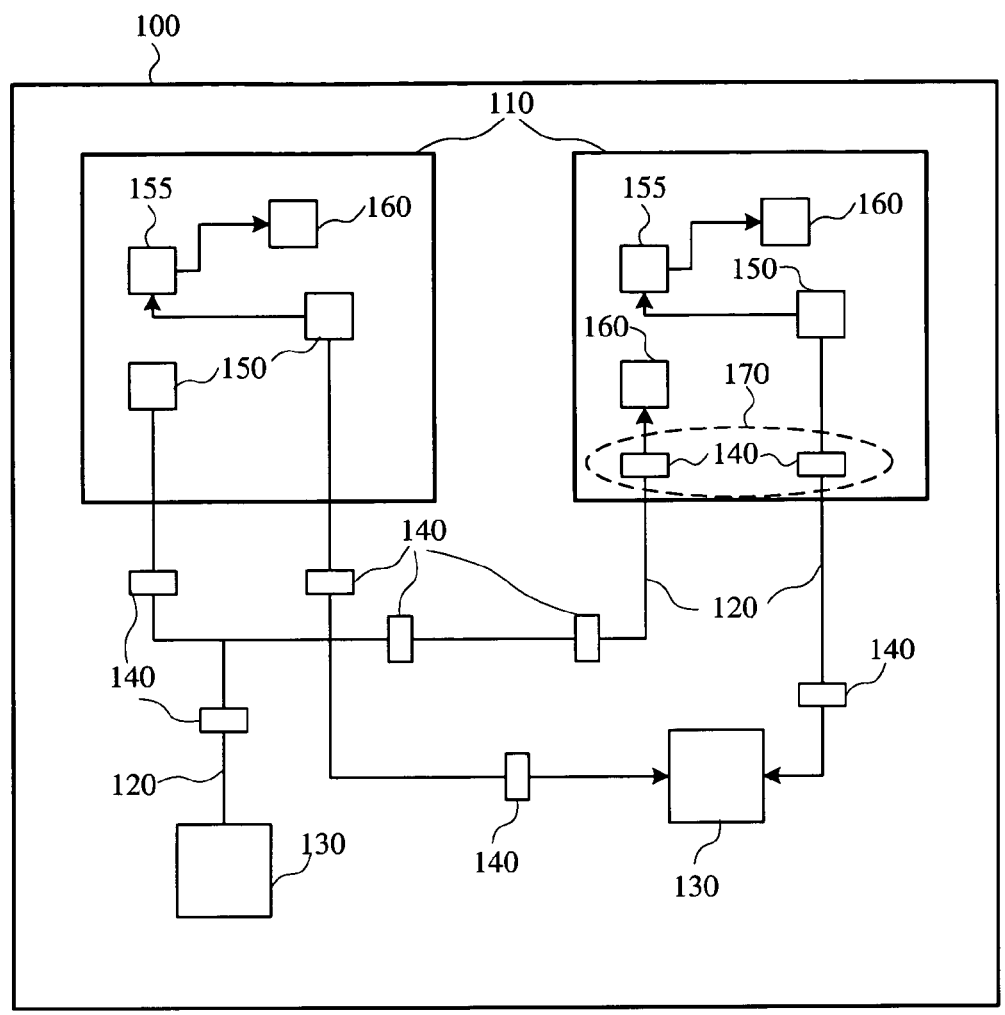
FIG. 1 is a diagram illustrating a central processing unit (CPU) with multiple cores.
Figure 2:
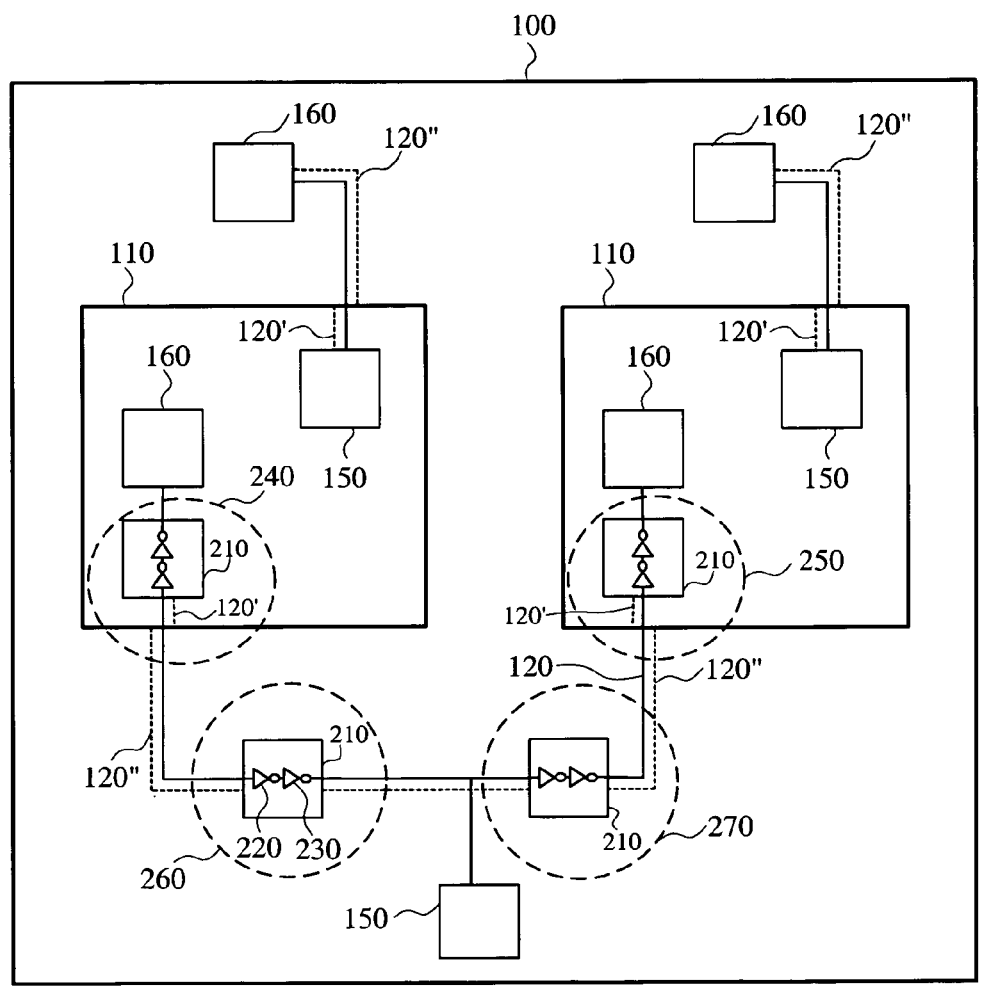
FIG. 2 is a diagram illustrating a central processing unit (CPU) with repeaters, in accordance with an embodiment of the invention.

FIG. 2 is a diagram illustrating a central processing unit (CPU) 100 with repeaters 210, in accordance with an embodiment of the invention. The CPU 100 includes two cores 110 that interconnect via the connector 120. In other embodiments, any number of cores 110 can be included in the CPU 100. Connector 120, which includes all the metallization lines in CPU 100, is further divided into a first interconnect 120' and a second interconnect 120". The first interconnect 120' includes all metallization lines within the core 110 and the second interconnect 120" includes all the metallization lines outside the boundary of the core 110. At various locations, circuit elements such as drivers 150 drive signals to receivers 160. Although the signal propagated via the connectors 120 are electrical signals signifying high and low voltage levels, the signal can be propagated via any method by which information travels through connectors 120.

Coupled to a first location 240, a second location 250, a third location 260, and a fourth location 270 is a plurality of repeaters 210. Each repeater 210 includes a first inverter 220 and a second inverter 230. The first inverter 220 and the second inverter 230 are circuit elements that invert the value carried by the signal propagated via the connector 120. For example, the first inverter 220 inverts a bit value of zero carried by the signal, to a value of one. Then, the second inverter 230 inverts the one back to zero. Thus, the repeater 210 buffers a value entering the first inverter 220 and leaving the second inverter 230. In other embodiments, the repeater 210 can be any other circuit element, such as a flip-flop, that buffers a value carried by the signal.

The two cores 110 have identical drivers 150, receivers 160, and repeaters 210. Specifically, first location 240 having a first repeater 210, and second location 250 having a second repeater 210, contain duplicate repeaters 210. Thus, in the embodiment shown in FIG. 2, the first location 240 and the second location 250 have instantiated repeaters 210 connected to the first interconnect 120' at a first level of a hierarchy. Further, after the instantiation of repeaters 210 in the first level of the hierarchy, repeaters 210 connected to the second interconnect 120" also buffer values in the third location 260 and the fourth location 270 outside the boundary of each core 110. The repeaters 210 located outside the boundary of the cores 110 are in a second level of the hierarchy. Accordingly, the repeaters inserted at each level in the hierarchy resolve problems in processor design.

Figure 3:
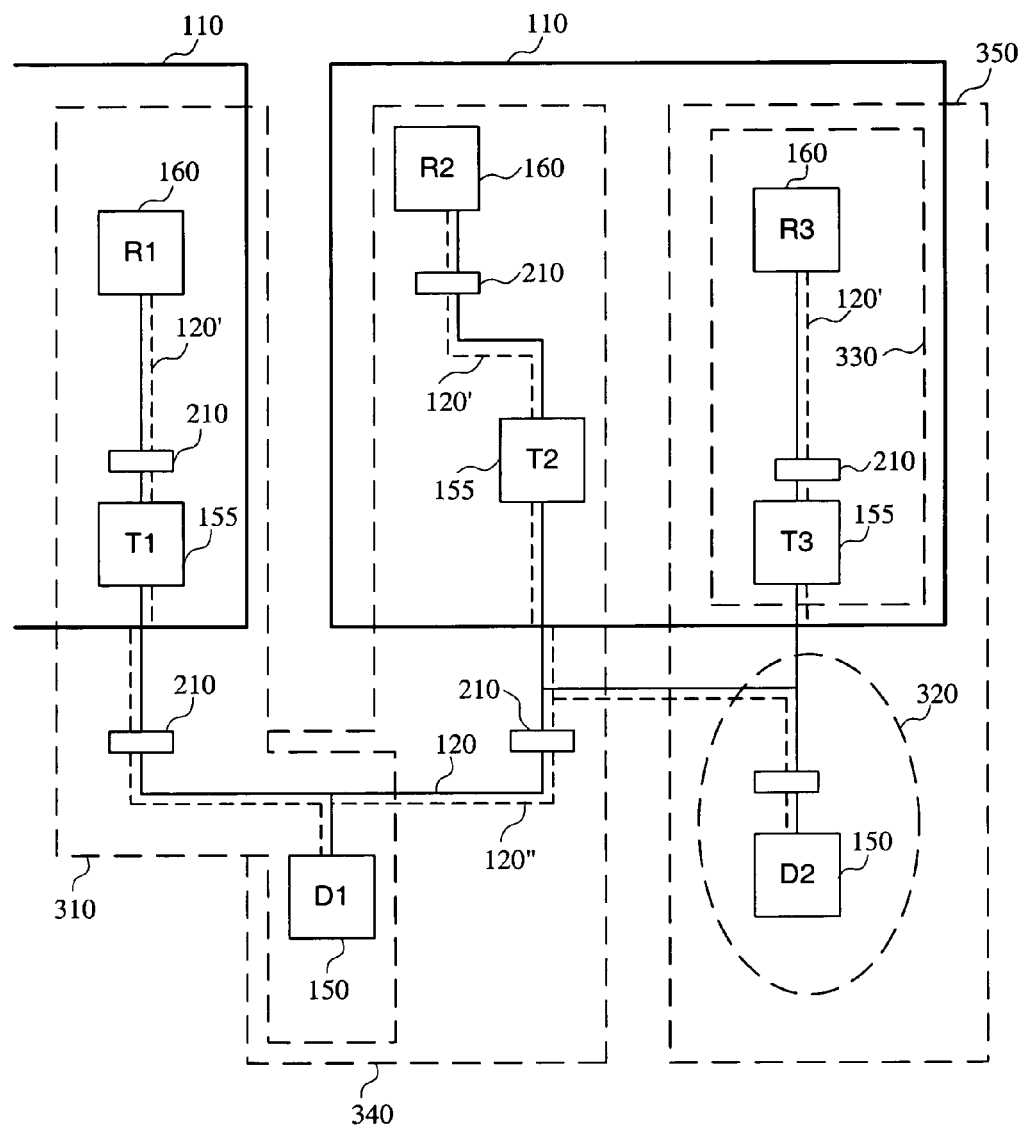
FIG. 3 is a diagram illustrating multiple cores, in accordance with an embodiment of the invention.

FIG. 3 is a diagram illustrating multiple cores 110, in accordance with an embodiment of the invention. A first net 310, a second net 340, and a third net 350 define sections of the circuit. Specifically, the first net 310 includes a D1 driver 150, a T1 transceiver 155, and an R1 receiver 160 with two repeaters 210. The second net 340 includes the D1 driver 150, a T2 transceiver 155, and an R2 receiver 160 with two repeaters 210. The third net 350 includes a D2 driver 150, a T3 transceiver 155, and an R3 receiver 160 with two repeaters 210. For each of the first net 310, the second net 340 and the third net 350, but only shown in the third net 350, are a core.net 330 and a top level net 320. The top level net comprises the circuit elements outside the boundary of the core 110. Although a core.net 330 is shown in FIG. 3, any component can define a component.net within the boundary of the component.

The design shown in FIG. 3 illustrates three flattened nets corresponding to the first net 310, the second net 340, and the third net 350. For example, in the first net 310, a trace of the circuit from the D1 driver 150 to the R1 receiver 160 is a flattened net. Accordingly, a flattened net also includes the core.net 330 and the top level net 320, as shown in the third net 350. After the derivation of flattened nets in a circuit, solutions for the nets involve inserting the repeaters 210 at different locations. One core solution is shown by one repeater 210 inserted between the T2 transceiver 155 and the R2 receiver 160 and another repeater 210 inserted between the T3 transceiver 155 and the R3 receiver 160. The core solution is then instantiated to other cores 110 in the CPU 100 (FIG. 2). Subsequently, another solution involving inserting repeaters outside the cores solves the top level net.

As previously discussed, the locations of repeaters 210 resolve timing problems and area constraints in processor design. Particularly, with respect to area constraints, if there are too many repeaters inserted outside the boundary, then one embodiment can solve the core.net 330 with more than two repeaters 210. Thus, after instantiation of the core.net solution to other cores 110, fewer repeaters 210 are added to the circuit outside the cores 110 and consequently, less area is used for repeaters.

Figure 4A:
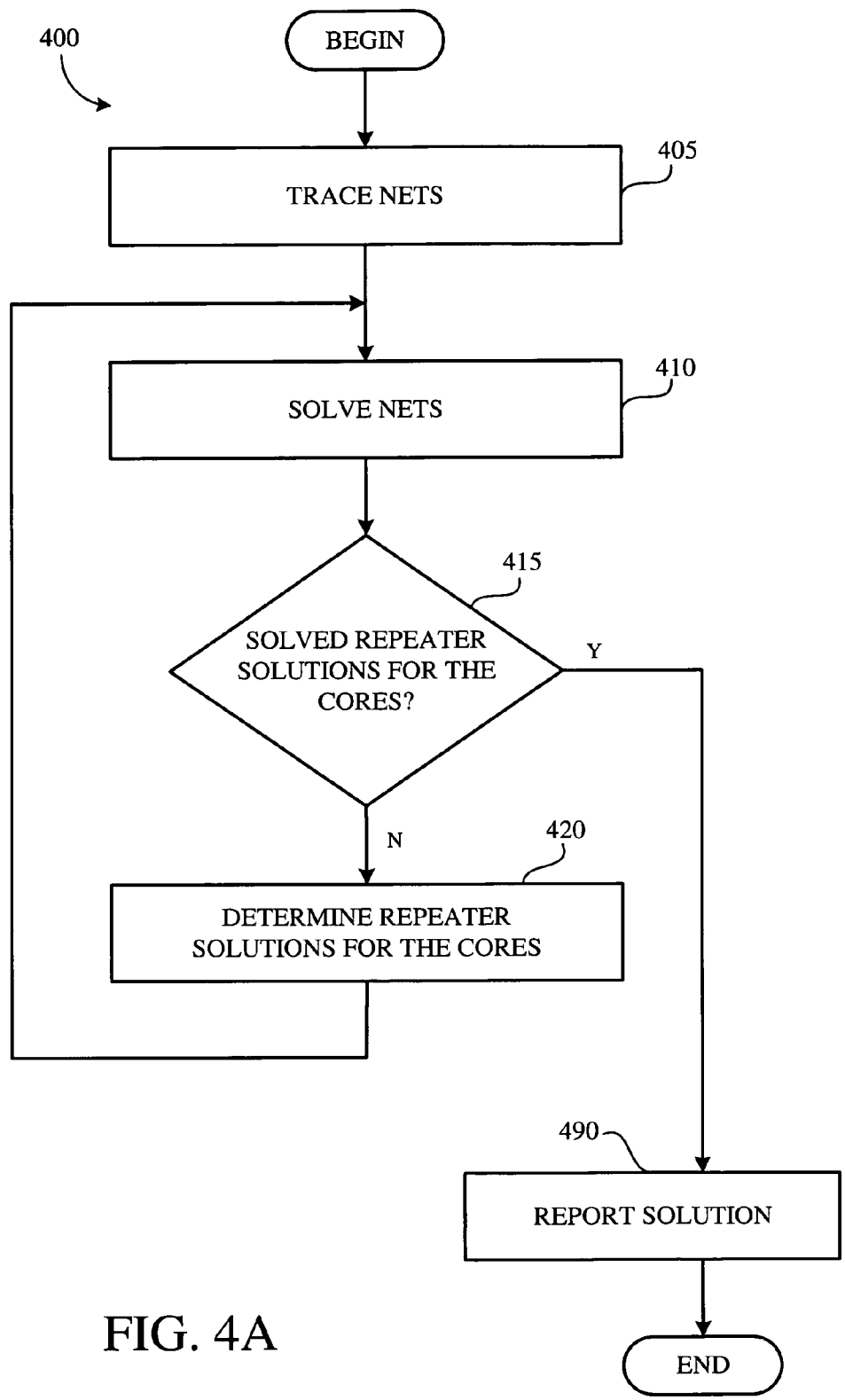
FIG. 4A is a diagram of a method for inserting repeaters, in accordance with an embodiment of the invention.

FIG. 4A is a diagram of a method 400 for inserting repeaters, in accordance with an embodiment of the invention. The method 400 begins in operation 405 by tracing the nets in a processor design. For example, all circuit traces of the design shown in FIG. 3 result in three nets. These flattened nets are then solved in operation 410. Solving the flattened nets involve inserting repeaters on the connectors 120 (FIG. 2) of the core.net 330 and the top level net 320, which will be discussed in detail in relation to FIGS. 4B–4D. Then, in operation 415, a decision is made whether there are solved repeater solutions for the cores 110. If there are repeater solutions for the cores 110, then there is a reported solution in operation 490, which also includes the repeater solution for the top level net 320 (FIG. 3). Thereafter, the method 400 ends. Alternatively, in operation 420, there is a determination of repeater solutions for the cores 110. After operation 420, the method 400 proceeds to operation 410 to determine a solution for the top level net 320.

Figure 4B:
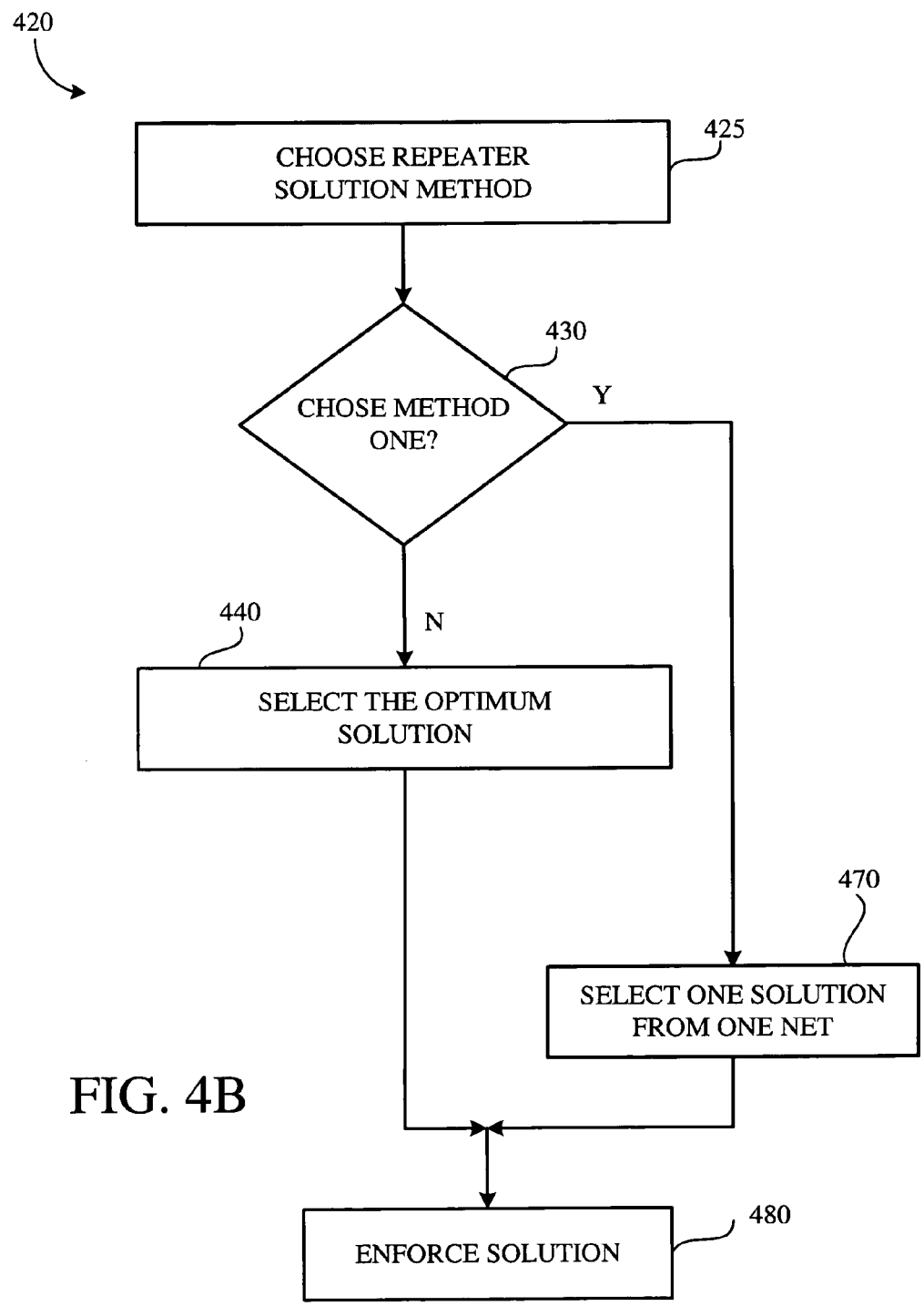
FIG. 4B is a diagram of a method for selecting repeater solutions, in accordance with an embodiment of the invention.

FIG. 4B is a diagram of a method for selecting repeater solutions, in accordance with an embodiment of the invention. Operation 420 begins with operation 425, which involves the choosing of a repeater solution method. In the following operation 430, if method one is chosen, the method proceeds to operation 470, where one repeater solution from a core.net 330 (FIG. 3) is selected. Subsequently, enforcing the solution in operation 480 signifies that the chosen repeater solution is instantiated to other cores 110, thus producing cores 110 with identical repeater solutions.

Alternatively, if method one is not chosen in operation 430, the method proceeds to operation 440, which involves the selection of the optimum repeater solution from a core 110. After the selection of the optimum repeater solution, the method proceeds to operation 480, where the optimum repeater solution is enforced to the other cores 110. Although two methods for selecting repeater solution are illustrated in FIG. 4B, other methods of selecting repeater solutions are possible. For example, a random selection of repeater solutions or another selection heuristic involving an optimum repeater solution is possible.

Figure 4C:
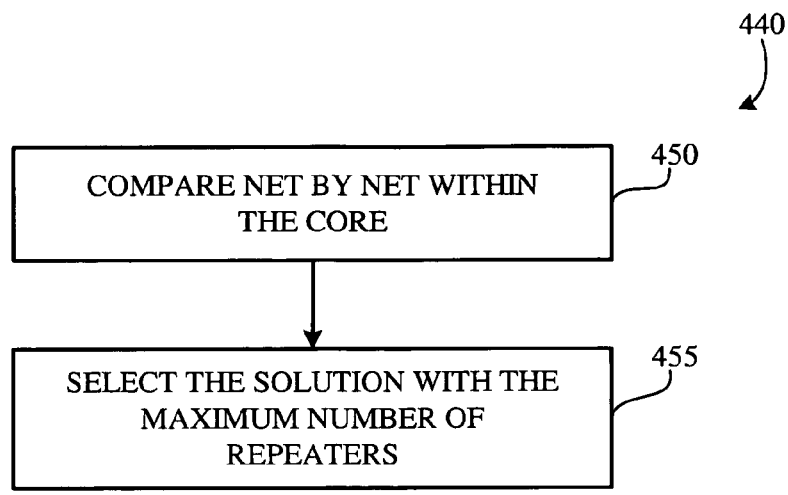
FIG. 4C is a diagram of a method for selecting repeaters, in accordance with an embodiment of the invention.

FIG. 4C is a diagram of a method for selecting repeaters, in accordance with an embodiment of the invention. In operation 440, when selecting an optimum repeater solution, operation 450 involves comparing each net within the core 110 with other nets in other cores 110. Subsequently, in operation 455, the optimum repeater solution involves selecting the solution with the maximum number of repeaters 210 (FIG. 2). In this embodiment, selecting the repeater solution with the maximum number of repeaters within the core 110 potentially reduces the number of repeaters inserted in the top level net 320.

Figure 4D:
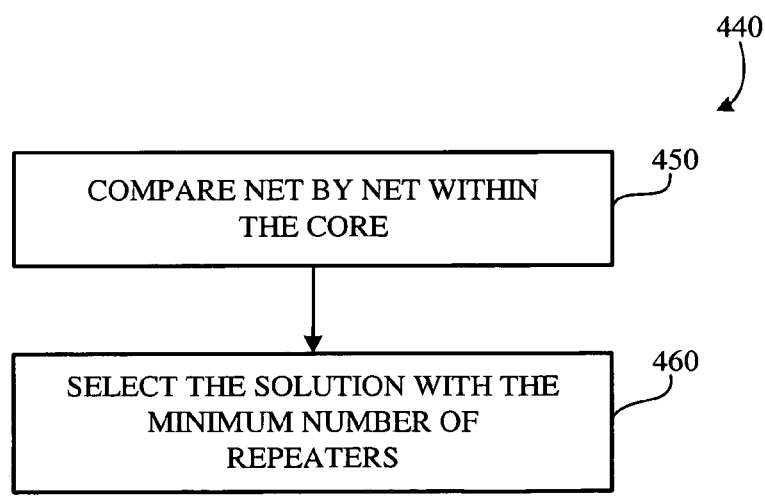
FIG. 4D is a diagram of a method for selecting repeaters, in accordance with an embodiment of the invention.

Alternatively, FIG. 4D is a diagram of a method for selecting repeaters, in accordance with an embodiment of the invention. In another embodiment, when selecting an optimum repeater solution, operation 450 involves comparing net by net within the core 110 with other nets in other cores 110 and subsequently, in operation 460, the optimum repeater solution involves selecting the solution with the minimum number of repeaters 210.

Figure 5:
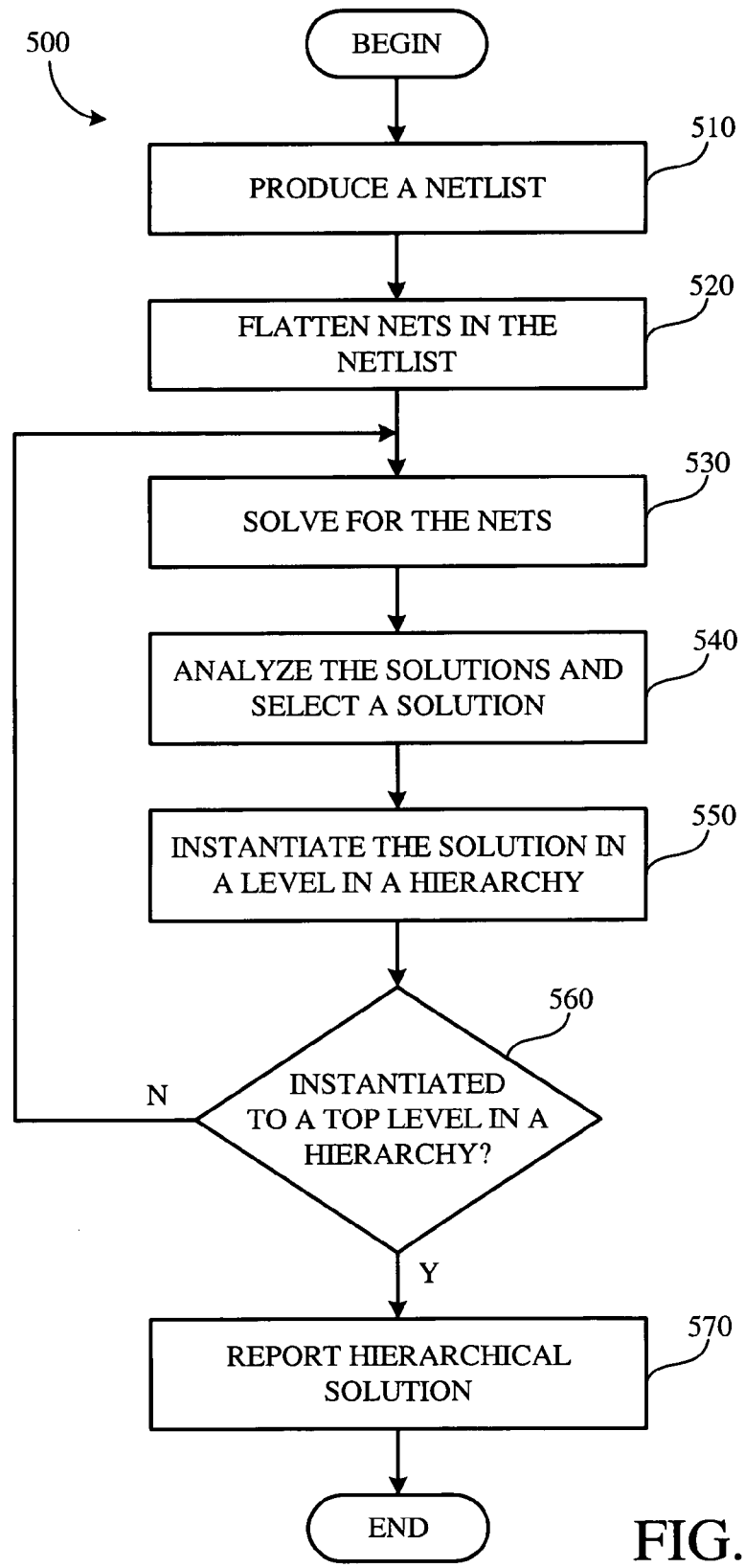
FIG. 5 is a diagram of a method for inserting repeaters, in accordance with an embodiment of the invention.

FIG. 5 is a diagram of a method 500 for inserting repeaters, in accordance with an embodiment of the invention. In an exemplary embodiment, a computer program performs the hierarchical repeater insertion. Method 500 begins in operation 510 by the computer program producing a netlist from a processor design. Specifically, the netlist includes a list of nets including the traces of each net. Then, in operation 520, the computer program flattens the nets in the netlist. Subsequently, in operation 530, the computer program solves for all the nets by inserting repeaters. In operation 540, the computer program analyzes the solutions and selects a solution. As previously discussed, the selection can involve selecting an optimum repeater solution or some other method.

Then, in operation 550, the computer program instantiates the solution in a level in a hierarchy by duplicating the repeater solution to other cores 110. In operation 560, the computer program determines if the solution has been instantiated to a top level in the hierarchy. If not, then the method proceeds to operation 530, where the net is solved for another level in the hierarchy. Once all levels in the hierarchy have instantiated solutions, the computer program reports the hierarchical solution and ends the method.

Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for solving a netlist for repeater insertion, the method comprising:
   tracing at least one net in a first core;
   determining a core repeater solution by solving the at least one net in the first core and identifying at least one repeater location in the first core;
   duplicating the repeater solution by instantiating the repeater solution into a second core; and
   determining an external repeater solution in a region of the circuit outside of the first core and the second core.

2. The method of claim 1, wherein the determining the core repeater solution further comprises solving for all nets in the first core by inserting repeaters.

3. The method of claim 1, wherein the determining the core repeater solution comprises finding an optimum repeater solution, wherein the optimum repeater solution has a maximum number of repeaters.

4. The method of claim 1, wherein the duplicating of the repeater solution comprises duplicating the at least one net internal to the first core to the second core.

5. The method of claim 1, wherein the determining of the external repeater solution comprises identifying a repeater location for a net external to the first core.

6. The method of claim 5, further comprising reporting the core repeater solution and the external repeater solution.

7. A computer program embodied on a computer readable medium for hierarchical repeater insertion, comprising:
   program instructions that produce a netlist for an integrated circuit from a plurality of nets, the integrated circuit including a plurality of processor cores;
   program instructions that flatten the netlist, the netlist including a first net internal to one of the processor cores and a second net external to the plurality of processor cores;
   program instructions that generate a solution for the first net by inserting a repeater along the first net;
   program instructions that instantiate the solution in each of the processor cores of the plurality of processor cores; and
   program instructions that insert a repeater in a top level net, the top level net including the second net.

8. The computer program of claim 7, wherein the program instructions that flatten the netlist identify circuit traces between a plurality of circuit elements.

9. The computer program of claim 7, wherein the program instructions that generate the solution for the first net select an optimum repeater solution, the optimum repeater solution including a maximum number of repeaters.

* * * * *